United States Patent [19]
Deeley

[11] Patent Number: 5,638,288
[45] Date of Patent: Jun. 10, 1997

[54] SEPARABLE CELLS HAVING WIRING CHANNELS FOR ROUTING SIGNALS BETWEEN SURROUNDING CELLS

[75] Inventor: Richard Deeley, San Jose, Calif.

[73] Assignee: LSI Logic Corporation, Milpitas, Calif.

[21] Appl. No.: 295,094

[22] Filed: Aug. 24, 1994

[51] Int. Cl.⁶ .............................. G06F 17/50; H01L 21/02
[52] U.S. Cl. .................... 364/489; 364/490; 364/491
[58] Field of Search ................................ 364/488, 489, 364/490, 491

[56] References Cited

U.S. PATENT DOCUMENTS

| | | | |
|---|---|---|---|
| 4,093,990 | 6/1978 | Koller et al. | 364/491 |
| 4,484,292 | 11/1984 | Hong et al. | 364/491 |
| 4,593,363 | 6/1986 | Burstein et al. | 364/491 |
| 4,613,941 | 9/1986 | Smith et al. | 364/490 |
| 4,615,011 | 9/1986 | Linsker | 364/491 |
| 4,686,629 | 8/1987 | Noto et al. | 364/488 |
| 4,752,887 | 6/1988 | Kuwahara | 364/488 |
| 4,777,606 | 10/1988 | Fournier | 364/491 |
| 4,831,725 | 5/1989 | Dunham et al. | 29/847 |
| 4,839,821 | 6/1989 | Murakata | 364/491 |
| 4,849,904 | 7/1989 | Aipperspach et al. | 364/488 |
| 4,858,143 | 8/1989 | Fournier | 364/489 |
| 4,890,238 | 12/1989 | Klein et al. | 364/488 |
| 4,903,214 | 2/1990 | Hiwatashi | 364/491 |
| 4,908,772 | 3/1990 | Chi | 364/488 |
| 4,918,614 | 4/1990 | Modarres et al. | 364/490 |
| 4,931,946 | 6/1990 | Ravindra et al. | 364/488 |
| 4,965,739 | 10/1990 | Ng | 364/491 |
| 4,975,854 | 12/1990 | Yabe | 364/491 |
| 4,978,633 | 12/1990 | Seefeldt et al. | 437/51 |
| 5,012,427 | 4/1991 | Kuribayashi | 364/491 |
| 5,036,473 | 7/1991 | Butts et al. | 364/489 |
| 5,065,355 | 11/1991 | Hayase | 364/491 |
| 5,072,402 | 12/1991 | Ashtaputre et al. | 364/490 |
| 5,089,973 | 2/1992 | Furtek | 364/489 |
| 5,113,352 | 5/1992 | Finnerty | 364/488 |
| 5,140,402 | 8/1992 | Murakata | 364/491 |
| 5,222,031 | 6/1993 | Kaida | 364/491 |
| 5,224,056 | 6/1993 | Chene et al. | 364/490 |
| 5,224,057 | 6/1993 | Igarashi et al. | 364/488 |
| 5,237,514 | 8/1993 | Curtin | 364/490 |
| 5,251,147 | 10/1993 | Finnerty | 364/490 |
| 5,260,881 | 11/1993 | Agrawal et al. | 364/489 |
| 5,272,645 | 12/1993 | Kawakami et al. | 364/491 |
| 5,295,082 | 3/1994 | Chang et al. | 364/490 |
| 5,308,798 | 5/1994 | Brasen et al. | 364/490 |
| 5,339,253 | 8/1994 | Carrig et al. | 364/488 |
| 5,349,542 | 9/1994 | Brasen et al. | 364/490 |
| 5,377,125 | 12/1994 | Hui et al. | 364/491 |
| 5,397,749 | 3/1995 | Igarashi | 364/488 |

*Primary Examiner*—Kevin J. Teska
*Assistant Examiner*—Tyrone V. Walker
*Attorney, Agent, or Firm*—Oppenheimer Poms Smith

[57] ABSTRACT

On integrated circuit designs employing large, pre-defined circuit blocks, chip area utilization and signal routing is improved by permitting signals between circuit blocks surrounding (e.g., on opposite sides of) a large circuit block (megacell) to physically pass through the megacell. The megacell is laid out so that a "parting line" is defined through the megacell. Circuits within the megacell are laid out so that no circuit "straddles" the parting line. The megacell can then be split or stretched about the parting line to create a wiring channel. The wiring channel is used for routing signals from the surrounding cells (circuit blocks) through the large circuit block (megacell). Signals between the separated portions of the stretched or split megacell on opposite sides of the parting line may be routed in one metal layer, while connections of surrounding cells through the megacell may be routed in another metal layer. A maximum split or stretch distance is defined for which the megacell performance specifications (e.g., timing constraints) will be met. A plurality of surrounding cells may be interconnected by routing their signals in stacked wiring layers. The megacell may be split or stretched about two or more parting lines to create two or more wiring channels.

25 Claims, 3 Drawing Sheets

SEPARABLE CELLS HAVING WIRING CHANNELS FOR ROUTING SIGNALS BETWEEN SURROUNDING CELLS

TECHNICAL FIELD OF THE INVENTION

The invention relates to the design and fabrication of integrated circuits, and more particularly to signal routing between circuit (functional) blocks, including cells, standard cells, and the like, especially in the context of semi-custom integrated circuits.

BACKGROUND OF THE INVENTION

In today's electronic marketplace, increasing emphasis is being placed upon rapid response to market demands. This emphasis is driven, at least in part, by the accelerating rate of change of semiconductor technology, particularly digital integrated circuit technology. Any product which lags the current state of technology by too great a margin may easily find itself left behind, as other, more sophisticated products dominate the marketplace. As a result, there are extreme pressures on electronic system designers to produce highly-complex, reliable digital systems in what would once have been considered impossibly short time frames. In order to meet size, space, and power dissipation constraints, custom (or semi-custom) integrated circuits are often necessary.

In response to these, and other, perceived needs, digital designers have turned to semi-custom integrated circuit design techniques, such as gate arrays and standard cells, to shorten the integrated circuit design cycle. Integrated circuits of this type are commonly referred to as ASICs or Application Specific Integrated Circuits, and are generally based upon pre-defined physical and functional integrated circuit building blocks which a designer can "plug" together rapidly to provide a desired function.

Of particular interest are standard-cell ASICs, wherein the functional building blocks are provided to the designer as "standard cells", in other words, as standard, pre-designed and pre-characterized (and fully tested) function modules (or cells). In addition to elementary logic functions, (such as gates, flip-flops, multiplexers, decoders, etc.) these function modules often include much higher level functions such as ALU's, multipliers, peripheral controllers, and complete microprocessors. Relatively large, complex standard cells are often termed "megacells". For any given semiconductor technology, these functional modules (e.g., circuit blocks) tend to have a corresponding standard shape, size and layout for which their electrical properties and responses have been completely characterized.

For the purposes of this specification, a "standard-cell" is defined as a pre-defined circuit function, which has a standard layout for inclusion on an integrated circuit die. For the purposes of this discussion, it is assumed that a megacell is physically larger than a cell, although either can be a standard cell.

By using standard cells in an integrated circuit design, a designer can manipulate highly-complicated digital functions while remaining highly confident that these functions are thoroughly tested over a wide range of operating characteristics and that they will perform according to their specifications. For example, a designer can incorporate a microprocessor megacell into a larger integrated circuit design almost as easily as one could incorporate an off-the-shelf (packaged, stand-alone) microprocessor into a printed circuit board design. It is generally accepted that the use of standard cell techniques can be used to design and obtain highly complex digital systems in significantly less time than might otherwise be possible. A designer can also incorporate non-standard surrounding logic into a design in addition to a microprocessor megacell. For purposes of this discussion, such surrounding logic is deemed to be divisible into distinct cells.

Standard-cell technologies are not without their problems and trade-offs, however. Large, pre-defined megacells generally have large, inflexible pre-defined shapes which restrict integrated circuit layout options (i.e., the ability to incorporate and interconnect other cells on the same chip). Interconnections between cells on opposite sides of a megacell must generally be routed around the megacell, thereby creating long signal paths. Further, these long signal paths tend to occupy an inordinate amount of space on the integrated circuit, thereby increasing the overall size of the die (integrated circuit chip). Longer signal paths also result in longer signal delays which can limit circuit performance. Since the cost of integrated circuits is closely related to die size, poor die area utilization (due to the space required for signal routing) leads to increased cost.

SUMMARY OF THE INVENTION

It is therefore an object of the present invention to provide an improved technique for routing signals in integrated circuits, especially in those employing standard cells.

It is a further object of the present invention to provide a technique for improving die area utilization in standard-cell integrated circuits.

It is a further object of the present invention to provide a technique for shortening signal interconnection length in standard-cell integrated circuits.

It is a further object of the present invention to provide greater flexibility with respect to the layout and routing of signals between standard-cells than present techniques.

It is a further object of the present invention to provide a technique which accomplishes the foregoing objects in a manner which is compatible with present integrated circuit layout tools.

According to the invention, a functional (circuit) block such as a megacell is separated (stretched or split) into two or more sub-blocks by one or more wiring channels passing physically through the megacell. Signals internal to the megacell ("internal signals") pass across the wiring channel from one sub-block (partition) to the other. Signals external to the megacell ("external signals"), from surrounding cells, pass through the wiring channel. A plurality of signal paths through the wiring channel can be established in two or more wiring levels, and related signals can be grouped in "tuples". In this manner, signal path length and area can be reduced for signals passing between two standard cells (pre-defined circuit blocks) on opposite sides of a large standard cell (megacell) by permitting the signals between the interconnected cells to pass through the megacell.

According to an aspect of the invention, the megacell is laid out so that a "parting line" is defined through the megacell. Circuits within the megacell are laid out so that no circuit "straddles" the parting line and, preferably, so that only less critical signals (e.g., from a timing point of view) cross the parting line. The megacell can then be split (e.g., into two portions) or stretched about the parting line to create a wiring channel through which signals from other cells may be routed. Preferably, the internal megacell signals which cross the wiring channel (e.g., those which cross the parting line prior to the stretch or split of the megacell) are routed in a separate wiring layer from the signals which pass through the megacell.

According to another aspect of the invention, multiple parting lines can be defined through a megacell to provide for more than one region of stretch or split.

According to an aspect of the invention, a stretchable megacell is provided by treating a megacell as a single logical entity which can be stretched about a parting line for providing a wiring channel through the megacell. In this case the wiring channel is treated as a feature of the megacell.

According to another aspect of the invention, a splittable megacell is provided by treating a megacell as two or more distinct megacell portions for which a maximum separation is specified. In this case, the megacell portions are treated separately, and the wiring channel exists as a space between the portions. As such the wiring channel is separate and distinct from either portion. Generally, a maximum separation between the portions of the megacell will be defined, which is not violative of pre-defined timing constraints.

According to another aspect of the invention, multiple stretch regions through a megacell can be oriented along non-parallel (e.g., perpendicular) parting lines to permit wiring channels through the megacell which accommodate signal wiring in different directions through (or across) the megacell.

According to another aspect of the invention, the design of the megacell is characterized for a range of stretch or split distances to determine the maximum separation of the megacell which can be tolerated while still meeting megacell performance (e.g., timing) specifications.

According to another aspect of the invention, the number of signals passing through a wiring channel (stretched or split region about a parting line) may be increased by routing them in vertically stacked "tuples" (groups of a kind) in separate wiring layers.

By providing one or more wiring channels through a megacell (or between split portions of a megacell), a "short-cut" is provided through which more optimal signal routing can occur for other cells on the chip. As a result less chip area is occupied by signal wiring than would be required if it were necessary to route those signals around the megacell. Further, the "short-cut" path through the wiring channel shortens those signal paths, thereby decreasing signal transmission delays over those signal paths and potentially improving chip performance over that which would be achieved if employing more conventional, circuitous signal routing techniques.

Other objects, features and advantages of the invention will become apparent in light of the following description thereof.

DETAILED DESCRIPTION OF THE INVENTION

Figure 1A:
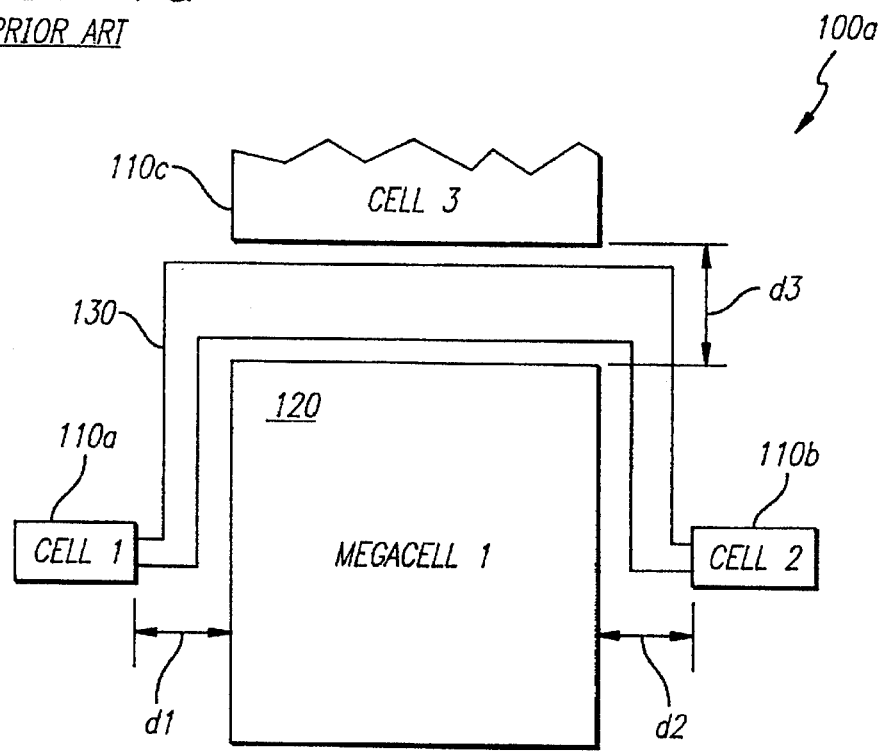
FIG. 1a is a schematic view of pre-defined circuit blocks on an integrated circuit where signals between two circuit blocks on opposite sides of a large circuit block are routed around the large circuit block, and is representative of the prior art. This, and the schematic views that follow, are illustrative of a top, plan view of actual cell structures as they may be laid out on an integrated circuit die.

FIG. 1a is a schematic view of a portion 100a of an integrated circuit device wherein three standard cells 110a (CELL 1), 110b (CELL 2), and 110c (CELL 3) are disposed around a large megacell 120 (MEGACELL 1). Signals lines (e.g., discrete lines, buses, etc.) 130 interconnecting cell 110a and cell 110b must travel around the periphery of the megacell 120 in what is, very noticeably, a circuitous path. As a result of the turns made by the path of signals 130 as they traverse between the cells 110a and 110b and the megacell 120, a distance (spacing) "d1" is required between the megacell 120 and the cell 110a, and a distance (spacing) "d2" is required between the megacell 120 and the cell 110b. Additionally, because the signals 130 must pass between the megacell 120 and the cell 110c, a distance (spacing) "d3" is necessitated between the cell 110c and the megacell 120. All of these distances d1, d2, and "d3" are greater than the corresponding distances which would be required if fewer signals were routed around the megacell and represent area on the die which is not well utilized (e.g., by functional blocks).

Additionally, the relatively long path of the signals 130 around the megacell 120 lengthens the signal delays between the cell 110a and the cell 110b as compared to a hypothetical straight line path between the cells 110a and 110b. In situations where timing is particularly critical, this additional delay can limit circuit performance.

One possible method of reducing signal path length and area is to provide a set of fixed "feed-throughs" in the megacell. For example, a set of 32 feed-through signals could be designed into the megacell such that up to 32 signals could be routed across the megacell. Unfortunately, such a megacell designed for 32 feed-throughs would permanently be enlarged by the amount of space required to accommodate the feed-through paths, even if none of the feed-through signals are used in a particular instance of the megacell. As a result, every design employing a megacell with fixed feed-through signals would impose a penalty on efficient area utilization on the die.

Even worse, it is possible that the fixed feed-throughs would cross the megacell in the wrong direction for a particular application. For example, if fixed feed-throughs were provided to cross a megacell in an east-west direction (as seen in a top view) but two cells located north and south of the megacell need to be heavily interconnected, then the fixed feed-throughs would not be particularly useful, requiring that still more chip area be used for routing the signals between the two (north, south) cells around the megacell.

According to the invention, the length and area required of a signal path between cells on opposite sides of a large megacell can be reduced by providing a megacell design which can be split or stretched to create a wiring channel through the megacell. One or more parting lines can be defined through the megacell about which the megacell can be split or stretched to form one or more of such wiring channels.

Figure 1B:
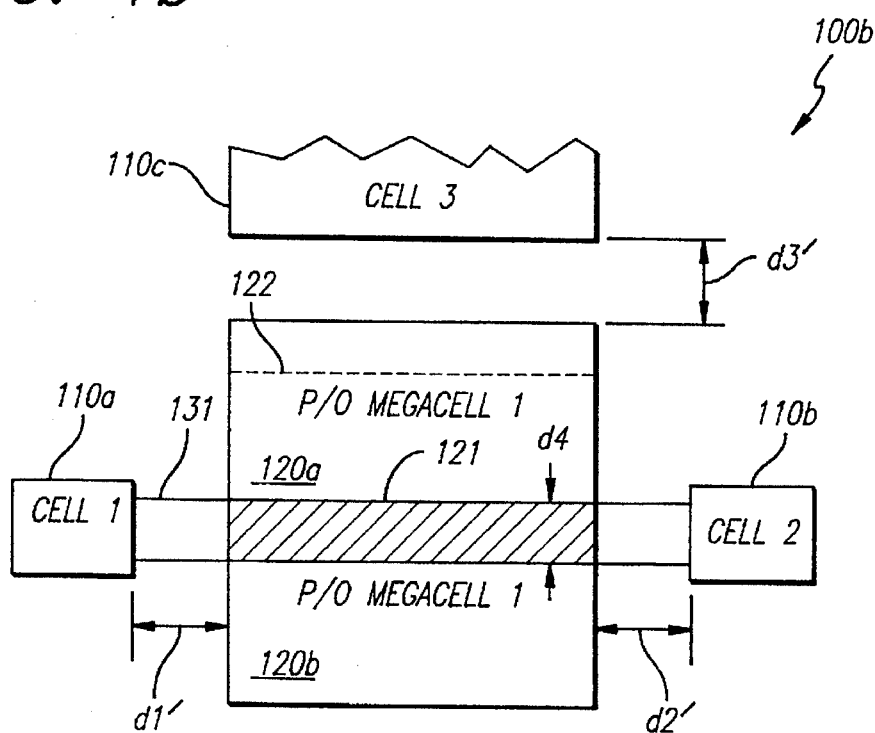
FIG. 1b is a schematic view of pre-defined circuit blocks on an integrated circuit, similar to the view of FIG. 1a, but where signals are routed through a wiring channel of a stretchable megacell, according to the present invention.

FIG. 1b is a top view of a portion 100b of an integrated circuit device, similar to FIG. 1a, but employing a stretchable megacell (P/O MEGACELL) comprising portions 120a and 120b. The stretchable megacell permits signals to be routed through the megacell, according to the present invention. The megacell 120 is, for purposes of this discussion, logically equivalent to the megacell 120 of FIG. 1a, but is designed to permit stretching by an amount sufficient to create a wiring channel 121 having a width of "d4" through the megacell 120. Signals 131 (again, for purposes of this discussion, the same as signals 130, but routed differently) are passed directly through the wiring channel 121 between the cell 110a and the cell 110b. Dashed line 122 shows the size of the megacell prior to stretching. The total size of the portions 120a and 120b and the wiring channel 121 is larger than the size of the megacell 120 prior to stretching.

Evidently, the two portions (partitions) 120a and 120b of the megacell will need to communicate with one another by passing signals back and forth to one another. For purposes of this discussion, such signals are considered to be internal to the megacell ("internal signals"). Signals from other functional blocks (e.g., 110a, 10b), which traverse the wiring channel across the megacell are considered to be external to the megacell ("external signals").

Internal signals traversing across the wiring channel 121, from one portion of the megacell to another portion of the megacell, are preferably all routed in one wiring layer. Similarly, external signals traversing through the wiring channel are all routed in another one or more wiring layers. Preferably, groups of related signals (e.g., from a one cell, across the wiring channel to another cell) are grouped in "tuples", in a single distinct one of the wiring layers.

Because of the direct (shortcut) route of the signals 131 through the megacell 120a, the distances d1' and d2' between the megacell and cells 110a and 110b, respectively, are decreased as compared to the corresponding distances d1 and d2 illustrated in FIG. 1a. The distance d3' between cell 110c and the megacell 120a is also dramatically reduced, as compared to the distance d3 (FIG. 1a). This represents a net gain in die space which may be utilized for fabricating active circuit elements (e.g., functional blocks).

Designing, modifying and storing megacells is a semi-automated process, suitably performed on an ECAD (Electronic Computer-Aided Design), the existence of which is well known to those having ordinary skill in the art to which the present invention most nearly pertains. The following U.S. Patents are noted as being of general interest, and are incorporated by reference herein as exemplary of the level of skill in the relevant art: U.S. Pat. Nos. 5,260,881; 5,036,473; 4,831,725; 5,012,427; 4,978,633; 4,839,821; 4,903,214; 5,089,973; 5,222,031; and 4,918,614.

According to the invention, in the process of designing a stretchable megacell, the starting point may be an unstretched megacell (e.g., such as the megacell 120). The megacell must be partitioned into two or more portions, and is preferably partitioned so the least critical internal signal lines need to cross the designed stretch area. (Goal-oriented partitioning techniques suited to this task are well known in the art and will be immediately understood and appreciated by those of ordinary skill in the art.) The megacell is also preferably characterized over a range of amounts of stretch (e.g., d4) to determine the maximum amount of stretch the megacell can tolerate while still performing according to its specification.

Many modern integrated circuit layout systems are designed to place and route based upon fixed cell designs. As such, they do not recognize the possibility of stretchable cells, or the possibility of a short-cut route (e.g., 121) through a cell. In order to accommodate such systems, it is possible to divide the megacell into two or more distinct portions, each of which may be placed independently by a layout system. A maximum separation between the megacell portions is defined for which the split megacell will perform correctly. The separation between the megacell portions provides a wiring channel(s) through which signals may be routed. Signals between the megacell portions cross the wiring channel(s) in another wiring layer. Because the megacell portions can be treated by the layout system as two distinct cells with a maximum separation constraint, creating "splittable" megacells is generally compatible with (within the capability of) most modern integrated circuit layout (e.g., ECAD) systems.

Figure 1C:
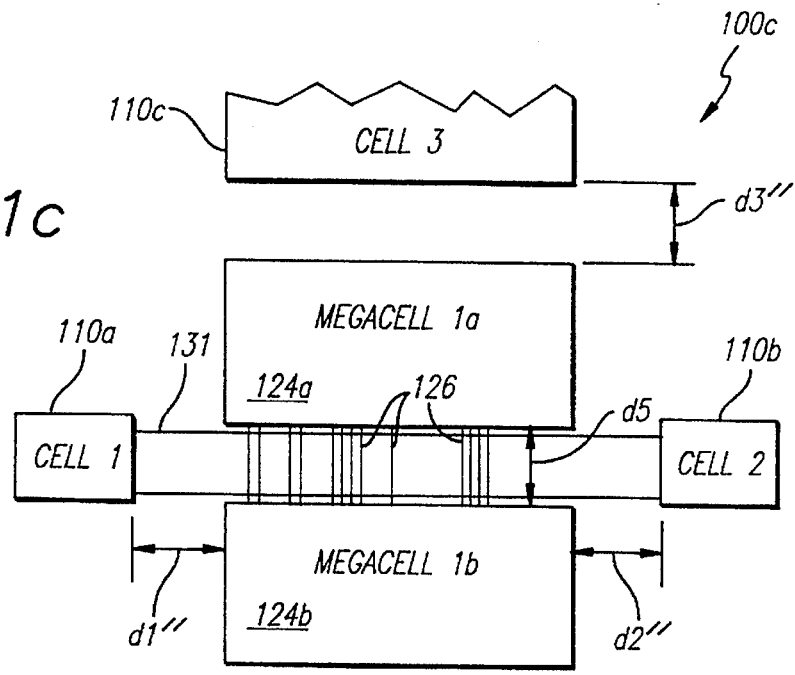
FIG. 1c is another schematic view of pre-defined circuit blocks on an integrated circuit, similar to FIG. 1b, but where a splittable megacell is employed to create a wiring channel, according to the present invention.

FIG. 1c is a top view of a portion 100c of an integrated circuit device, similar to FIG. 1b, but employing a split megacell rather than a stretched megacell. In this case, the megacell is split into two discrete portions 124a and 124b. The combination of the two megacell portions 124a (MEGACELL 1a) and 124b (MEGACELL 1b) performs a function which, for purposes of this discussion, is logically equivalent to that of the fixed megacell shown in FIG. 1a and of the stretchable megacell shown in FIG. 1b. A separation distance "d5" between the megacell portions 124a and 124b provides a wiring channel (similar to 121) through which the external signals 131 are routed. Internal signals 126, between one megacell portion 124a and the other megacell portion 124b, cross the wiring channel 131, preferably in a separate wiring layer. Distances d1", d2", and d3" between the megacell (i.e., the combination of the megacell portions 124a and 124b) and the cells 110a, 110b, and 110c, respectively, are comparable to distances d1', d2' and d3' shown in FIG. 1b.

Generally, there is no logical difference between a "stretchable" megacell (e.g., FIG. 1b) and a "splittable" megacell (e.g., FIG. 1c), other than in the way the two different types of cells are viewed by a layout system. In either case, the megacell is designed in much the same way. Stretchable megacells and splittable megacells may both be considered as "separable" megacells, which are partitioned (into two or more sub-blocks) such that at least one parting line is defined, about which portions of the megacell may be separated. As mentioned above, preferably partitioning goals are chosen such that the least critical signals of the megacell cross the parting line. The megacell is then analyzed over a range of separation distances to determine the maximum amount of separation (stretch or split) which the megacell can tolerate while still meeting its design specifications (e.g., intended functionality).

FIGS. 1b and 1c illustrate stretching and splitting (collectively referred to herein as "separating"), respectively, of a megacell about a single parting line. According to the invention, it is also possible to define more than one parting line about which a megacell may be split or stretched. Such a megacell is created in much the same manner as has been described hereinabove. Parting lines are defined about which the megacell design will be partitioned. The parting lines need not be parallel to one another, although they may be, but can be chosen to cross the megacell in any desired direction, including intersecting one another. The partitioning goals are preferably chosen such that the least critical signals cross partitioning lines. The megacell is then characterized to determine maximum tolerable separation of the megacell portions about the various parting lines.

Figure 2A:
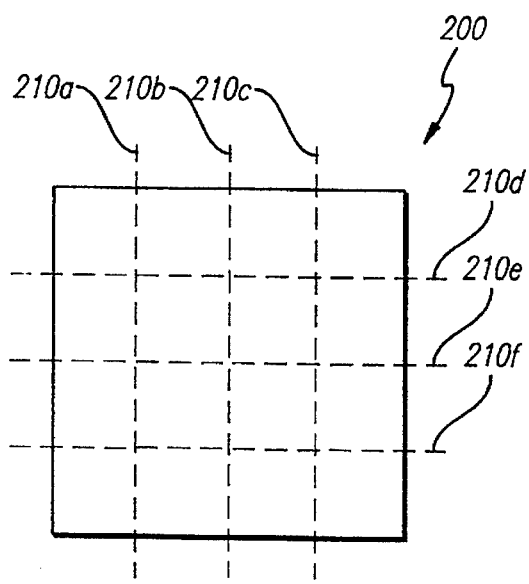
FIG. 2a is a schematic view of the area occupied by a splittable/stretchable megacell, showing multiple parting lines about which the megacell can be split or stretched, according to the present invention.
Figure 2B:
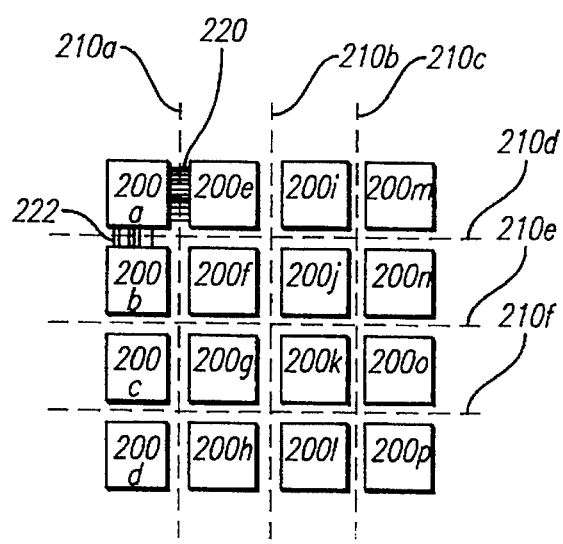
FIG. 2b is a schematic view of the megacell area of FIG. 2a after splitting/stretching about the multiple parting lines, according to the present invention.

A multi- (greater than two) partitioned megacell of this type is shown and described with respect to FIGS. 2a and 2b, wherein the surrounding cells (e.g., 10a, 110b and 110c) are omitted, for illustrative clarity.

FIG. 2a is a top view of a megacell 200 through which a plurality of parting lines are defined. Parting lines 210a, 210b and 210c cross the megacell 200 in a vertical (as depicted) direction, while parting line 210d, 210e, and 210f cross the megacell 200 in a horizontal (as depicted) direction.

FIG. 2b illustrates the partitioning of the megacell 200 about the parting lines 210a–f. The megacell 200 is partitioned about the parting lines 210a–f such that only the least critical internal signals cross the parting lines 210a–f. This effectively divides the megacell 200 into a plurality of distinct megacell portions 200a, 200b, 200c, 200d, 200e, 200f, 200g, 200h, 200i, 200j, 200k, 200l, 200m, 200n, 200o, and 200p. Signals 220 between megacell portions 200a and 200e cross the parting line 210a. Signals 222 between the megacell portions 200a and 200b cross the parting line 210d. Similar connections occur between other megacell portions cross the parting lines in much the same manner. However, in order to minimize illustrative clutter, these have been omitted from the figure.

By providing multiple parting lines, it is possible to select a stretch or split point through a megacell which provides the shortest route for the external signals which are to be routed therethrough. Alternatively, the megacell can be split or stretched about more then one parting line to provide, for example, parallel wiring channels through the megacell or orthogonal wiring channels through the megacell.

In the case of orthogonally oriented wiring channels (crossed wiring channels), it is possible to provide full signal pass through without requiring an additional wiring layer. This is accomplished, for example, by routing all signals passing in a north-south direction (e.g., top to bottom as seen in plan view) in one wiring layer while routing all signals which pass in an east-west direction (e.g., left to right as seen in plan view) in another wiring layer. Taking the example of FIG. 2b, if the megacell is split about parting lines 210a and 210d, then the signals 220 and all signals passing through the wiring channel about parting line 210d would be routed in one wiring layer while the signals 222 and all the signals passing through the wiring channel about parting line 210a would be routed in another wiring layer.

In order to increase the number of signals which can be routed through a wiring channel of a stretched or split megacell, multiple wiring layers can be employed to provide stacking of signals. This is illustrated in FIG. 3.

Figure 3:
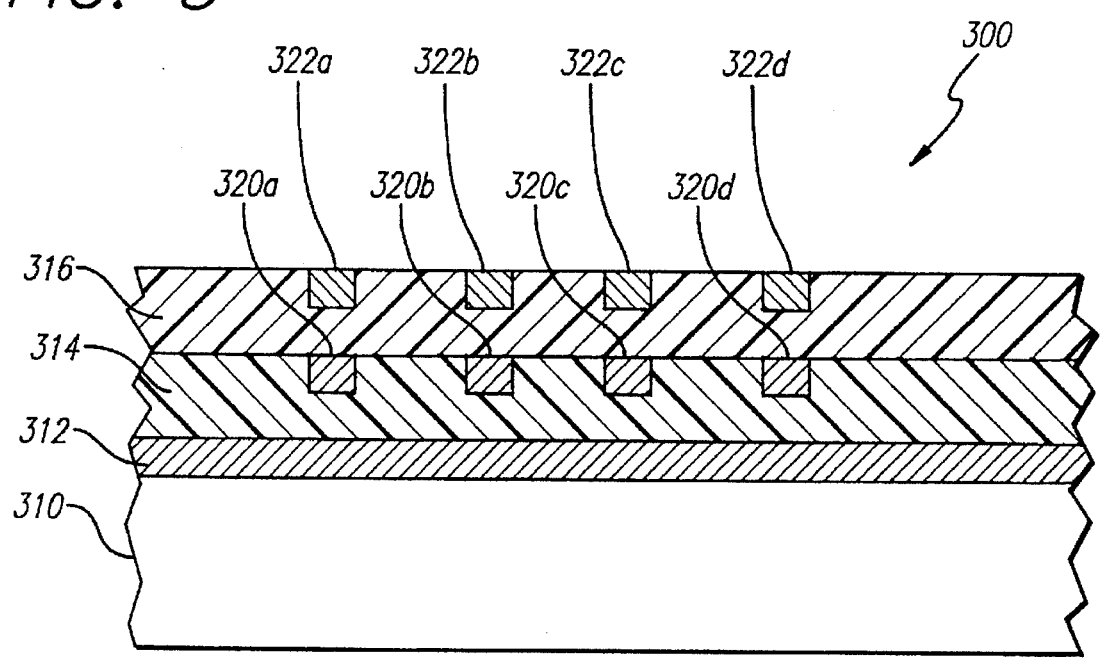
FIG. 3 is a cross-sectional view of a wiring channel through a splittable/stretchable megacell wherein signal carrying conductors are stacked to permit more than one signal to pass through a wiring "track" in the wiring channel, according to the present invention.

FIG. 3 is a cross-section of a stretched portion 300 of a megacell, illustrating the concept of "stacking" signals to increase the number of connections that can be made along a fixed number of "tracks" in the stretched area. A conductive line 312 (one shown, typically many) connects two portions (e.g., 124a, 124b) of a split megacell in a first wiring layer, by traversing across a wiring channel separating the two portions. In a second wiring layer, disposed atop the first wiring layer 312, conductive lines 320a, 320b, 320c, and 320d run through the wiring channel 310 perpendicular to the line 312 and separated therefrom by an insulating oxide layer 314. In a third wiring layer, disposed atop the second wiring layer, conductive lines 322a, 322b, 322c, and 322d run through the wiring channel, immediately above and parallel to conductive lines 320a–d and separated therefrom by a second insulating oxide layer 316. By stacking conductive lines (wires) on top of one another (e.g., 320a, 322a) more than one group ("tuple") of related signals can traverse the same path through the split (or stretched) megacell.

One of ordinary skill in the art will immediately appreciate that the paths or "tracks" can also be staggered by layer, if desired. In other words, the conductors of each wiring layer need not be vertically aligned (as illustrated in FIG. 3).

In order to accommodate two-tier stacking (as shown in FIG. 3) 3-layer metallization is required. N-layer (such as 3-layer) metallization yields N–1 tier (such as two tier) stacking of signals through the wiring channel. Although the internal signal line 312 between megacell portions is shown in a bottom-most wiring layer with stacked external signals (320a–d, 322a–d) in overlying layers, there is generally no particular significance to or limitation upon the particular ordering of the individual wiring layers.

Figure 4:
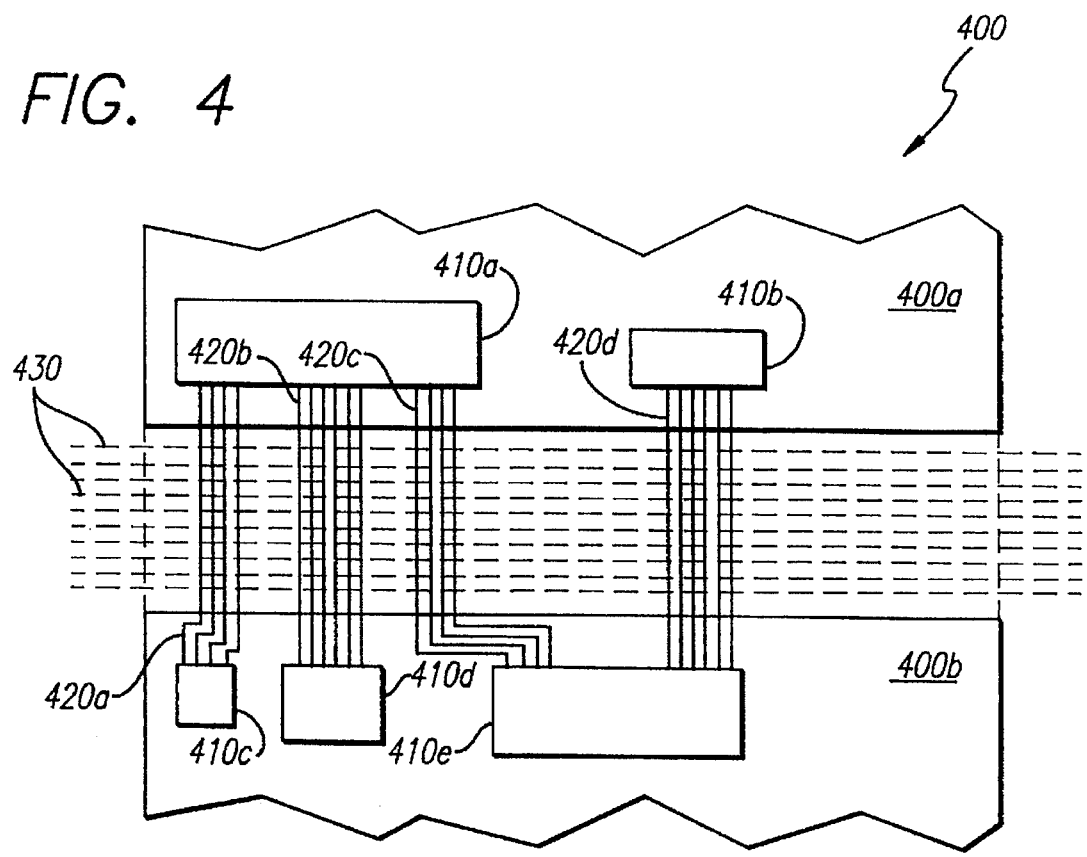
FIG. 4 is a top view of a wiring channel through a split megacell showing wiring "tracks" through the wiring channel, according to the present invention.

FIG. 4 is a plan view of a stretched megacell 400 illustrating wiring "tracks" 430 through a wiring channel between two megacell portions 400a and 400b in which signal carrying lines can be stacked, as described with respect to FIG. 3. Megacell portion 400a includes circuit blocks 410a and 410b. Megacell portion 400b includes circuit blocks 410c, 410d, and 410e. (It is immaterial to this discussion what function a particular block 410 . . . 410e performs. It is only relevant that they interact with one another as portions of a larger megacell.)

Circuit block 410a connects to circuit block 410c via wires (conductive lines) 420a, which cross the wiring channel (and tracks 430) between the megacell portions 400a and 400b. Circuit block 410a also connects to circuit block 410d via wires 420b and to circuit block 410e via wires 420c. Wires 420b and 420c also cross the wiring channel. Circuit block 410b connects to circuit block 410e via wires 420d, which cross the wiring channel between the megacell portions 400a and 400b. Preferably all of the wires 420a–420d carrying internal signals cross the wiring channel in a single wiring layer (e.g., as conductive lines 312 in the first wiring layer of FIG. 3), and all of the wires 430 traversing the channel from one external (to the megacell) to another external cell (e.g., from the cell 110a to the cell 110b) are fabricated in another wiring layer (e.g., as conductors 320a . . . 320d, in the second wiring layer of FIG. 3).

It is within the spirit and scope of the present invention that the techniques described hereinabove be employed either alone or in combination. That is, a megacell can be either stretchable or splittable about one or more parting lines to form one or more corresponding wiring channels through the megacell, can be partitioned about one or more parting lines which need not necessarily be parallel to one another, and can employ signal stacking in any or all of the wiring channels. It should also be understood that these techniques of splitting, stretching and the like can be applied to any electronic cell, including standard cells, megacells, and the like, regardless of its size.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention.

What is claimed is:

1. A method of routing connections between circuit blocks on an integrated circuit device, comprising:

providing an integrated circuit device having a first circuit block and a plurality of second circuit blocks;

separating the first circuit block into a plurality of sub-blocks to provide a wiring channel running between a pair of adjacent sub-blocks, such that a total size of the adjacent sub-blocks and the wiring channel is larger than a size of the first circuit block prior to separation; and routing connections between at least two of the plurality of second circuit blocks through the wiring channel; wherein the adjacent sub-blocks are separated by a distance which is greater than or equal to that distance necessary to create a wiring channel large enough to accommodate the connections, and is no larger than a distance "d" which ensures that the separated first circuit block operates within performance specifications which include timing constraints.

2. The method according to claim 1, wherein the first circuit block is separated by stretching the first circuit block about a parting line.

3. The method according to claim 1, wherein: the first circuit block is separated by splitting the first circuit block about a parting line.

4. The method according to claim 1, wherein the first circuit block is a megacell.

5. The method according to claim 1, wherein: at least a pair of the plurality of second circuit blocks are standard cells.

6. The method according to claim 1, wherein: the first circuit block are physically larger than the pair of second circuit blocks.

7. The method according to claim 1, wherein: two or more wiring channels are provided through the first block.

8. The method, according to claim 1, wherein the plurality of second circuit blocks are interconnected through the wiring channels.

9. A separable megacell for integrated circuit design, comprising:

a pre-defined logic function including a plurality of circuit blocks, said pre-defined logic function having a pre-defined shape and size;

a parting line through the pre-defined logic function, said circuit blocks being partitioned within the pre-defined logic function about the parting line; and a maximum separation distance defined for the predefined logic function by which circuit blocks on opposite sides of the parting line can be separated while continuing to meeting a pre-defined set of performance specifications for the pre-defined logic function; and a wiring channel through the pre-defined logic function about the parting line, said wiring channel dividing the megacell into two distinct portions; wherein:

the circuit blocks are interconnected by a plurality of signals, some of which are more timing-critical than others; and the circuit blocks are partitioned about the parting line such that only the least timing-critical signals cross the parting line.

10. A separable megacell for integrated circuit design according to claim 9, further comprising:

a wiring channel through the pre-defined logic function about the parting line, said wiring channel dividing the megacell into two distinct portions.

11. A separable megacell for integrated circuit design according to claim 10, wherein:

the two distinct portions and the wiring channel are treated as a single logical entity.

12. A separable megacell for integrated circuit design according to claim 10, wherein:

the two distinct portions are treated as two separate logical entities, with a maximum split distance between the two portions being defined as being equal to the maximum separation distance.

13. A separable megacell for integrated circuit design according to claim 9, wherein at least two parting lines through the pre-defined logic function are oriented parallel to one another.

14. A separable megacell for integrated circuit design according to claim 9, wherein:

at least two parting lines through the pre-defined logic function are oriented along non-parallel paths.

15. A method of designing an integrated circuit, comprising the steps of:

providing a plurality of pre-defined cells;

providing a separable megacell through which a parting line passes;

separating the megacell about the parting line to form a wiring channel, such that a total size of the megacell and the wiring channel after separation of the megacell is larger than a size of the megacell prior to separation;

routing signals between at least two of the pre-defined cells through the wiring channel; and defining a maximum separation distance about the parting line; wherein:

the megacell is separated about the parting line by a distance less than or equal to the maximum separation distance; and the megacell is separated about the parting line by a distance greater than or equal to that distance necessary to create a wiring channel large enough to accommodate the signals routed therethrough.

16. A method of making an integrated circuit according to claim 15, further comprising the step of treating the separated megacell and the wiring channel therethrough as a single logical entity.

17. A method of making an integrated circuit according to claim 15, further comprising the step of treating the separated megacell as two or more distinct logic entities, with the wiring channel occurring as between the two or more distinct logic entities.

18. A method of making an integrated circuit according to claim 15, further comprising the steps of:

defining at least two parting lines along substantially parallel paths through the separable megacell; and separating the megacell about the at least two parting lines to form at least two corresponding substantially parallel wiring channels.

19. A method a making an integrated circuit according to claim 15, further comprising the steps of:

defining at least two parting lines through the separable megacell along non-parallel paths; and separating the separable megacell about the two nonparallel parting lines to form at least two corresponding nonparallel wiring channels.

20. A method of making an integrated circuit according to claim 15, further comprising the steps of:

routing signals between the separated portions of the separable megacell in a first wiring layer; and routing the signals which pass through the wiring channel in a least one second wiring layer, distinct from the first wiring layer.

21. A method of making an integrated circuit according to claim 20, further comprising the step of routing the signals which pass through the wiring channel in two or more second wiring layers.

22. A method of making an integrated circuit according to claim 21, further comprising the step of routing the signals in the second wiring layers in a vertically stacked configuration.

23. A method of making an integrated circuit according to claim 21, further comprising the step of routing the signals in the two or more second wiring layers in a vertically staggered configuration.

24. A method of forming connections between circuit blocks on an integrated circuit, comprising:

defining, on an integrated circuit, two first circuit blocks;

defining, on the integrated circuit, a second circuit block between the two first circuit blocks;

defining a first parting line through the second circuit block;

separating the second circuit block about the first parting line to form a first wiring channel, such that a total size of the second circuit block and the first wiring channel after separation of the second circuit block is larger than a size of the second circuit block prior to separation; and routing signals between the two first circuit blocks through the first wiring channel; wherein:

the first wiring channel has a width which is greater than or equal to that necessary to accommodate the connections, and is no larger than a distance "d" which ensures that the separated second circuit block operates within performance specifications which include timing constraints.

25. A method of forming connections between circuit blocks on an integrated circuit according to claim 24, further comprising:

defining at least one second parting line through the second circuit block;

separating the second circuit block about the second parting line to form a second wiring channel; and routing signals through the second wiring channel.

* * * * *